United States Patent
Song et al.

(10) Patent No.: US 7,025,651 B2
(45) Date of Patent: *Apr. 11, 2006

(54) LIGHT EMITTING DIODE, LIGHT EMITTING DEVICE USING THE SAME, AND FABRICATION PROCESSES THEREFOR

(75) Inventors: Kyung-Sub Song, Seoul (KR); Young-Ho Park, Suwon (KR); Chang-Yong Lee, Sungnam (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 345 days.

This patent is subject to a terminal disclaimer.

(21) Appl. No.: 10/635,496

(22) Filed: Aug. 7, 2003

(65) Prior Publication Data

US 2004/0027067 A1 Feb. 12, 2004

Related U.S. Application Data

(62) Division of application No. 09/981,793, filed on Oct. 19, 2001, now Pat. No. 6,670,751.

(30) Foreign Application Priority Data

May 24, 2001 (KR) .................................. 2001-28685

(51) Int. Cl.
*H01J 9/00* (2006.01)

(52) U.S. Cl. .......................................... 445/50; 438/20

(58) Field of Classification Search .................... 445/50, 445/51; 313/506–512; 438/106, 122, 112, 438/124–127, 20; 257/10, 99
See application file for complete search history.

(56) References Cited

U.S. PATENT DOCUMENTS 5,998,925 A 12/1999 Shimizu et al.
6,069,440 A 5/2000 Shimizu et al.

FOREIGN PATENT DOCUMENTS

JP 2000-315826 11/2000

*Primary Examiner*—Joseph Williams
(74) *Attorney, Agent, or Firm*—Lowe Hauptman & Berner, LLP

(57) ABSTRACT

Disclosed is a LED which can be mounted at high density on a large area display. Having a hole for heat sink in the ceramic substrate, the LED is superior in heat sink property. In order to fabricate the light emitting device, first, a secondary ceramic sheet is stacked on the ceramic substrate, followed by forming electrodes in a predetermined pattern on the secondary ceramic sheet around the hole for heat sink. On the ceramic substrate, an upper ceramic sheet with an opening is stacked to form a stacked ceramic substrate in such a way that a part of the electrodes are exposed through the opening. After co-firing the stacked ceramic substrate, a light emitting diode chip is mounted on the secondary ceramic sheet at a position corresponding to the hole for heat sink. Then, the electrodes are electrically connected with the LED chip, and the LED chip is sealed with insulating resin. A light emitting device using the LED and a fabrication method therefor are also disclosed.

19 Claims, 17 Drawing Sheets

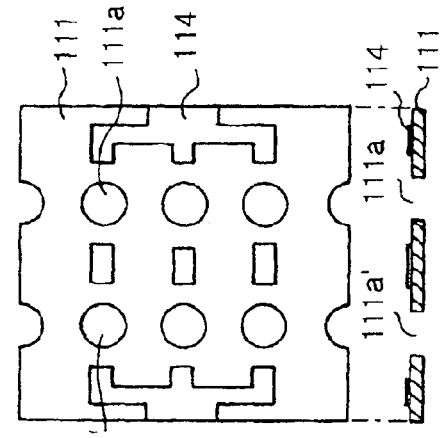
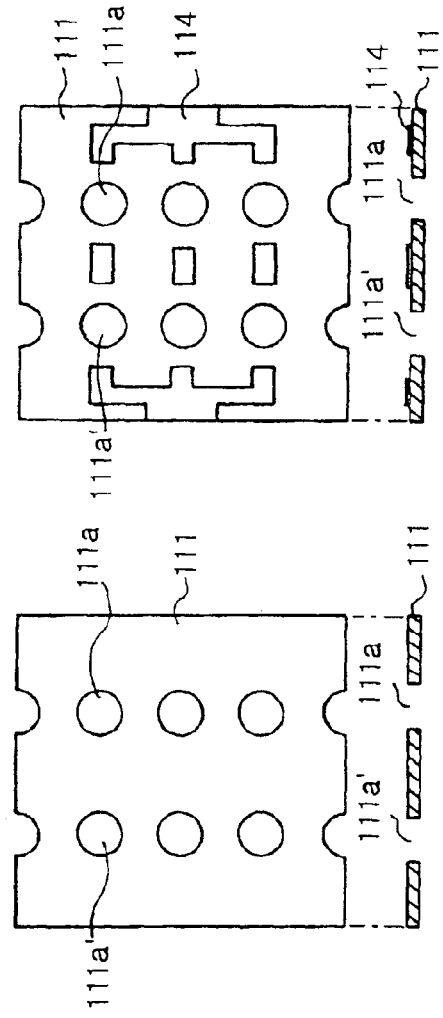
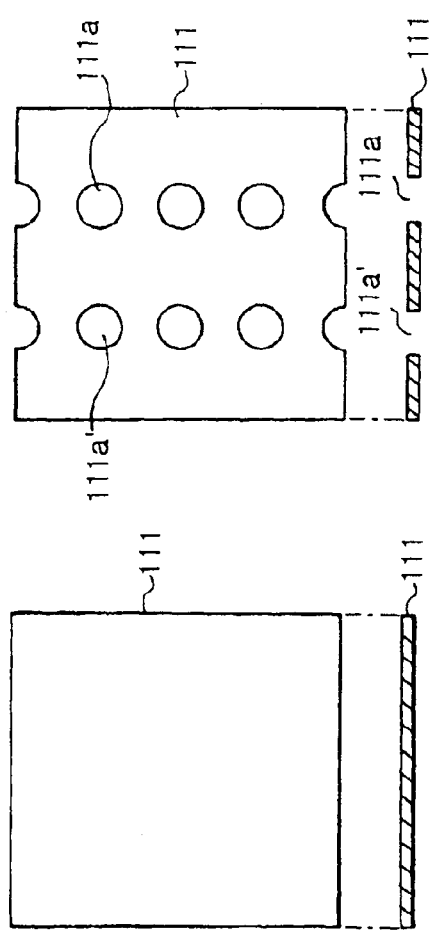
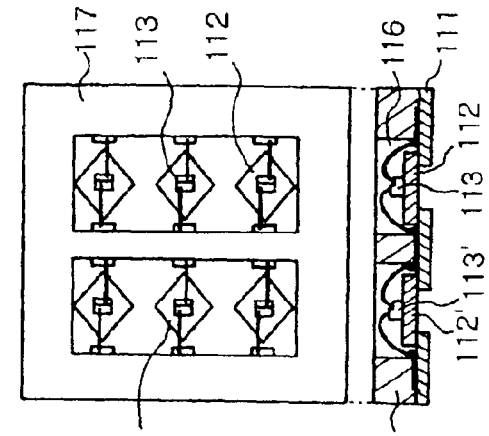
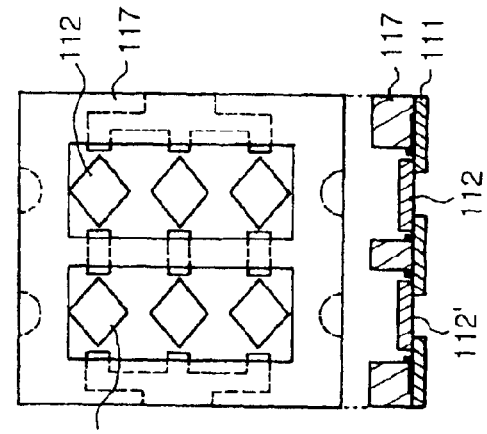
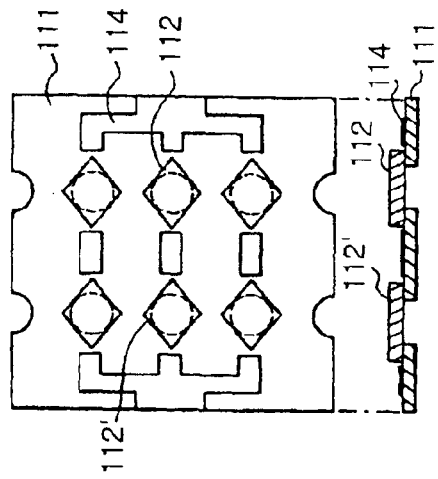

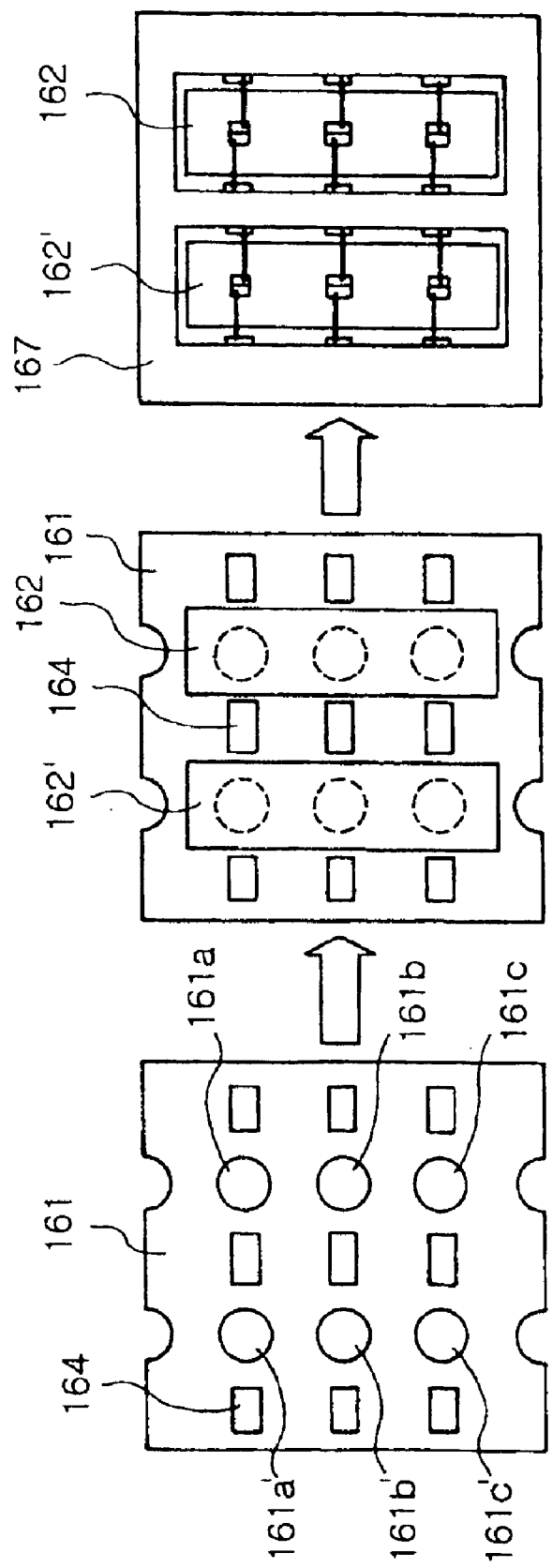

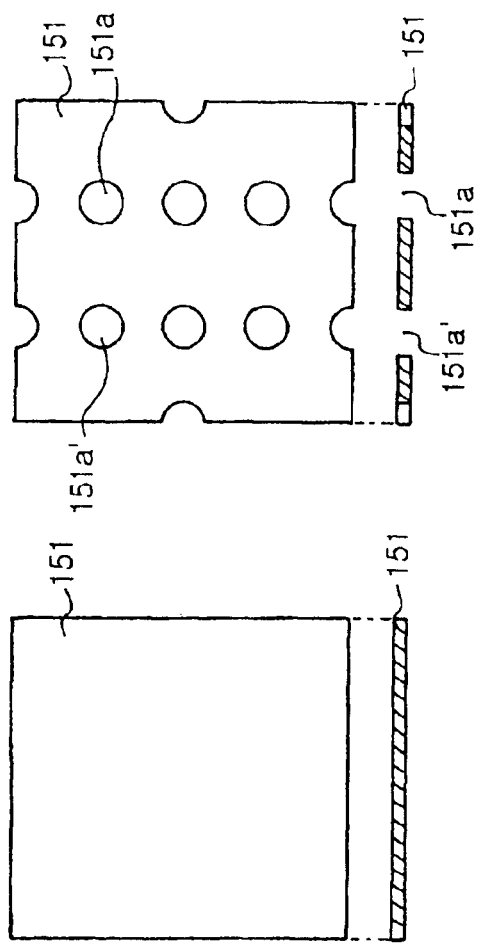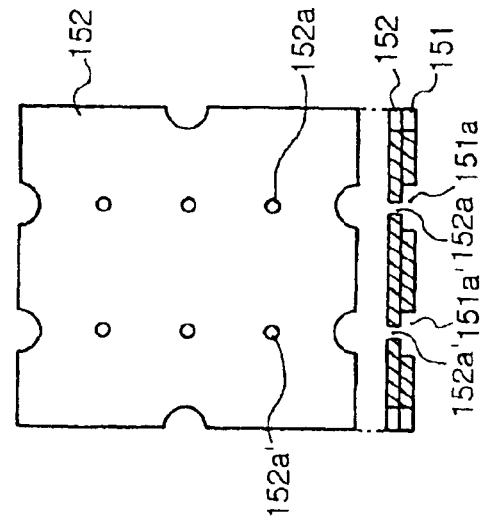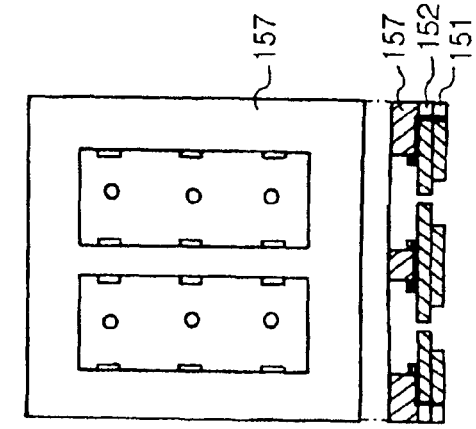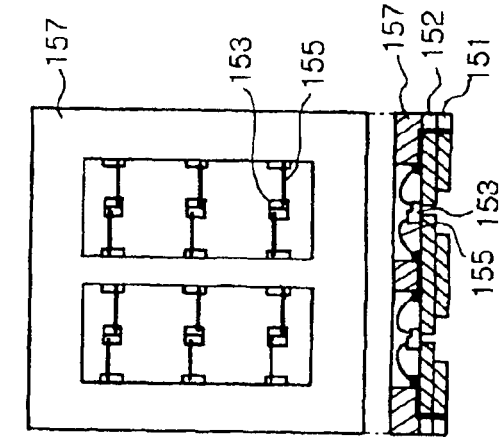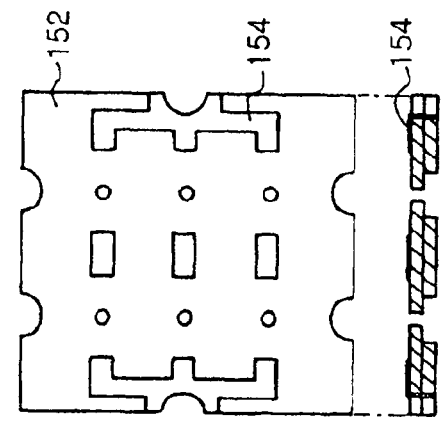

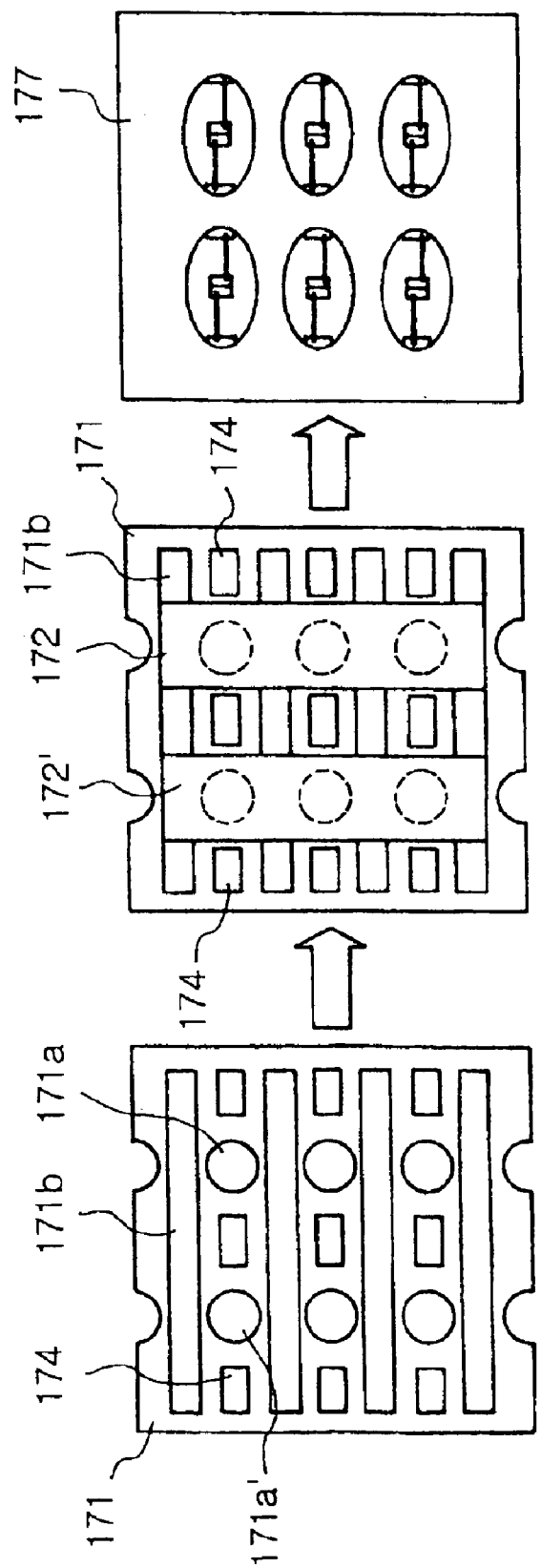

LIGHT EMITTING DIODE, LIGHT EMITTING DEVICE USING THE SAME, AND FABRICATION PROCESSES THEREFOR

This application is a division of Ser. No. 09/981,793 filed Oct. 19, 2001, now U.S. Pat. No. 6,670,751.

BACKGROUND OF THE INVENTION

1. Field of the Invention

The present invention relates to a light emitting diode (hereinafter referred to as "LED"), and a fabrication process therefor. More particularly, the present invention relates to a high-density mounting LED suitable for use in large area light emitting device display and illuminating facilities and a fabrication process therefor. Also, the present invention relates to a light-emitting device using the LED with a superior heat sink property and a fabrication process therefor.

2. Description of the Prior Art

LED is one kind of solid lighting indicators. LEDs for single colors including RGB (red, green and blue) colors, three primary colors of light, have been followed by LEDs for W (white) colors, which have utilized in more various fields. Recently, LEDs have been developed from lamp types to surface mount device (SMD) types that allow LEDs to be mounted at so high a density as to make a large area display. According to such a tendency, LEDs are used in a broader applications, from indicators to back light sources for LED displays, further to a next-generation lighting system which is substitutive for conventional lighting system such as incandescent electric lamps, fluorescent lamps or street lamps. Unlike general lamps, lighting systems using LEDs have simple lighting circuits and need not invert circuits nor core type ballasts. Over incandescent lamps, LED luminaire has the advantage of being lower in maintenance cost because of its being operated at less electrical power, with 10-times longer lifetime.

Representative example of white LED applicable to luminaire is disclosed in Japanese Pat. Laid-Open Publication No. 2000-315826 which describes a light emitting device composed of an LED and a phosphor. The light emitting device of this patent, as shown in FIG. 1a, comprises a blue LED chip 3 mounted on a ceramic substrate 1, a first transparent coating 6 covering the blue LED chip 3, a second transparent coating 6a positioned on the first transparent coating 6, and an electrode electrically connected to the LED chip 3 via a wire 5, the second transparent coating 6a containing a phosphorescent material. In this structure, the fluorescent material absorbs the visible light beam emerging from the LED chip to radiate fluorescent light so that mixing the visible light of the LED chip with the fluorescent light emitted from the fluorescent material results in emission of white light. This light emitting device can emit homogenous white light with excellent efficiency. Another LED which is able to emit white light may be found in relevant literature (e.g., U.S. Pat. Nos. 5,998,925 and 6,069,440).

Generally, appliances with these LEDs are known deteriorate in light emitting properties mainly owing to thermal stress. In a lighting system or a traffic signal, which is fabricated by mounting a multitude of conventional LED chips on a substrate at a high density, as shown in FIG. 1b, LEDs suffer from more overheating than LEDs in any other applications and have a tendency to radiate heat in proportion to the total lighting area. Particularly in the case of blue LEDs, the heating problem is more serious because they are operated at higher voltages compared to LEDs of other colors. Further, the larger areas of LED luminaire aggravate the performance and out-of-order rate of the LEDs used. This trend is also found when LEDs are mounted at higher densities in a given area. Conventional light emitting devices, most of which are structured as illustrated in FIG. 1b, are so poor in heat sink capability as to show a limit in mounting LED chips with a high density in a large area.

SUMMARY OF THE INVENTION

Therefore, it is an object of the present invention to provide an LED which can be mounted at high density in a large area with a superior heat sink property.

It is another object of the present invention to provide a method for fabricating such an LED.

It is a further object of the present invention to provide a light emitting device fabricated with the LEDs, which shows high heat sink properties even with a large area.

It is still a further object of the present invention to provide a method for fabricating such a light emitting device.

It is still another object of the present invention to provide a light emitting unit assembly for large area using the light emitting devices.

In an aspect of the present invention, there is provided a light emitting diode, comprising: a ceramic substrate having a hole for heat sink, the ceramic substrate being formed electrodes in a predetermined pattern thereon around the hole; a secondary ceramic sheet covering the hole for heat sink to mount a LED chip; a LED chip mounted on the secondary ceramic sheet over the hole to be electrically connected with the electrodes through wires; an upper ceramic sheet formed on the ceramic substrate, the upper ceramic sheet surrounding the LED chip; and an insulating layer formed to seal the LED chip within the upper ceramic sheet.

In accordance with another aspect of the present invention, there is provided a method for fabricating a light emitting diode, comprising the steps of: preparing a ceramic substrate having a hole for heat sink, the ceramic substrate being formed electrode patterns in a predetermined pattern thereon around the hole; stacking a secondary ceramic sheet on the ceramic substrate to cover the hole for heat sink; stacking on the ceramic substrate an upper ceramic sheet with an opening to form a stacked ceramic substrate in such a way that a part of the electrode patterns and a part or all of the secondary ceramic sheet are exposed through the opening; co-firing the stacked ceramic substrate; mounting a LED chip on the secondary ceramic sheet at a position corresponding to the hole after disposing electrodes on the electrode patterns of the ceramic substrate; and sealing the LED chip within the upper ceramic sheet with an insulating resin after electrically connecting the electrodes with the LED chip.

In accordance with a further aspect of the present invention, there is provided a light emitting device, comprising: a ceramic substrate having a plurality of holes for heat sink, the ceramic substrate being formed electrodes in a predetermined pattern thereon around each of the holes; secondary ceramic sheets covering each of the holes for heat sink to mount LED chips; a plurality of LED chips mounted on the secondary ceramic sheets over each of the holes to be electrically connected with the electrodes through wires; an upper ceramic sheet formed on the ceramic substrate, the upper ceramic sheet surrounding the LED chips; and an insulating layer formed to seal the LED chips within the upper ceramic sheet.

In accordance with still a further aspect of the present invention, there is provided a method for fabricating a light emitting device, comprising the steps of: preparing a ceramic substrate having a plurality of holes for heat sink, the ceramic substrate being formed electrode patterns in a predetermined pattern thereon around each of the holes; stacking secondary ceramic sheets on the ceramic substrate to cover each of the holes for heat sink; stacking on the ceramic substrate an upper ceramic sheet with an opening to form a stacked ceramic substrate in such a way that a part of the electrode patterns and a part or all of the secondary ceramic sheets are exposed through the opening; co-firing the stacked ceramic substrate; mounting LED chips on the secondary ceramic sheets at a position corresponding to each of the holes after disposing electrodes on the electrode patterns of the ceramic substrate; and sealing the LED chips within the upper ceramic sheet with insulating resin after electrically connecting the electrodes with the LED chips.

In accordance with still another aspect of the present invention, there is provided a large area light emitting assembly, composed of a multitude of the light emitting devices.

BRIEF DESCRIPTION OF THE DRAWINGS

The above and other objects, features and other advantages of the present invention will be more clearly understood from the following detailed description taken in conjunction with the accompanying drawings, in which:

FIG. 1b is a schematic cross sectional view showing a light emitting device using the LED of FIG. 1a;

FIG. 8 illustrates processes for fabricating a light emitting device in plane views and corresponding cross sectional views, in accordance with another embodiment of the present invention;

FIG. 9 illustrates processes for fabricating a light emitting device in plane views, in accordance with another embodiment of the present invention;

FIG. 10 illustrates processes for fabricating a light emitting device in plane views and corresponding cross sectional views, in accordance with a further embodiment of the present invention;

FIG. 11 illustrates processes for fabricating a light emitting device in plane views, in accordance with another embodiment of the present invention;

DETAILED DESCRIPTION OF THE PREFERRED EMBODIMENTS

Figure 1A:
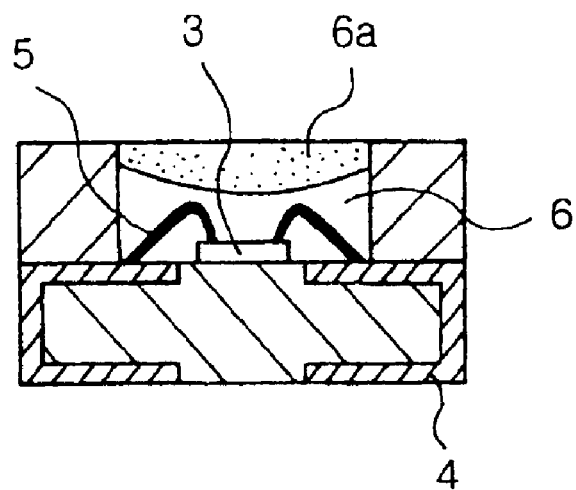
FIG. 1a is a schematic cross sectional view showing a conventional LED.
Figure 1B:
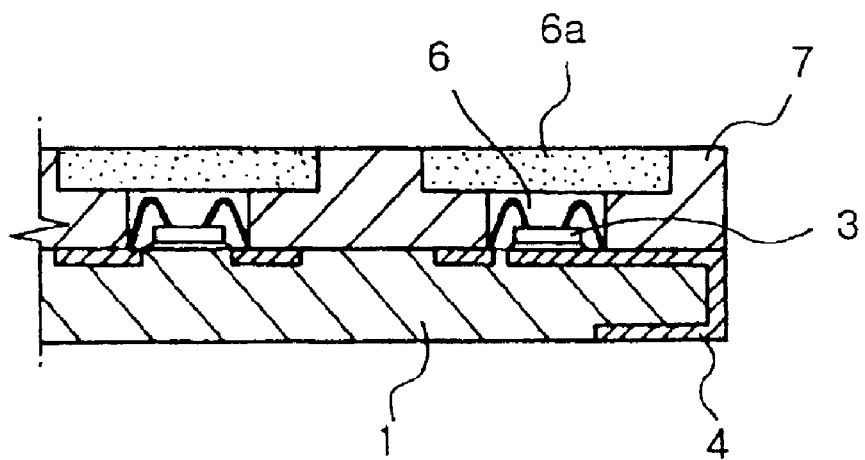

Leading to the present invention, the intensive and through research for improving the heat-sink property of an LED, conducted by the present inventors, resulted in finding structures which suffer a minimum of thermal stress.

The application of the preferred embodiments of the present invention is best understood with reference to the accompanying drawings, wherein like reference numerals are used for like and corresponding parts, respectively.

Before the present invention are disclosed or described, it is to be understood that the terminology used therein is for the purpose of describing particular embodiments only and is not intended to be limiting.

[LEDs and Fabrication Thereof]

In accordance with an aspect, the present invention pertains to LEDs which are superior in heat sink properties, and fabrication thereof.

Figure 2A:
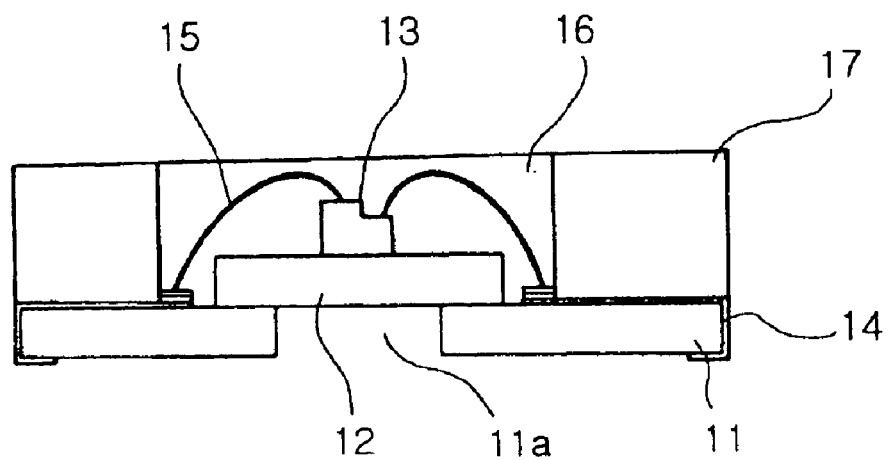
FIG. 2 schematically shows the structure of an LED in a cross sectional view and a plane view, in accordance with an embodiment of the present invention.

With reference to FIG. 2, a structure of a LED is schematically illustrated in a cross sectional view (a) and in a plane view (b), in accordance with an embodiment of the present invention. As seen in these figures, the LED of the present invention comprises a ceramic substrate 11, a secondary ceramic sheet 12 located on the ceramic substrate 11, an insulating layer 16, an upper ceramic sheet 17, an LED chip 13, and electrodes 14.

In this embodiment, the ceramic substrate 11 has a hole for heat sink 11a. The electrodes are patterned on the surface of the ceramic substrate 11 at opposite sides of the hole 11a. Positioned below the LED chip, the hole for heat sink 11a preferably functions to immediately release the heat generated by the LED chip to air to minimize the thermal stress of the LED. The shape of hole for heat sink could be achieved by various design such as rectangle, polygons, etc. Any materials may be used as the substrate if it allows LED chips to be mounted at high density thereon. Examples of the useful ceramic substrate include alumina, quartz, calcium zirconate, frostbite, SiC, graphite, fused silica, mulite, cordierite, zirconia, beryllia, and aluminum nitride with preference for alumina and SiC. More preferable is alumina. Alumina ceramic is of high electrical insulation and thermal conductivity. Particularly, alumina ceramic emits less radiation in addition to being superior in thermal resistance, chemical resistance, and mechanical strength, compared to other ceramic substrates. Further, alumina ceramic can be used for multi-layer ceramic packages (MLP), which are superior in air tightness, by forming patterns of metal wires thereon and firing the patterned alumina ceramic.

Figure 2B:
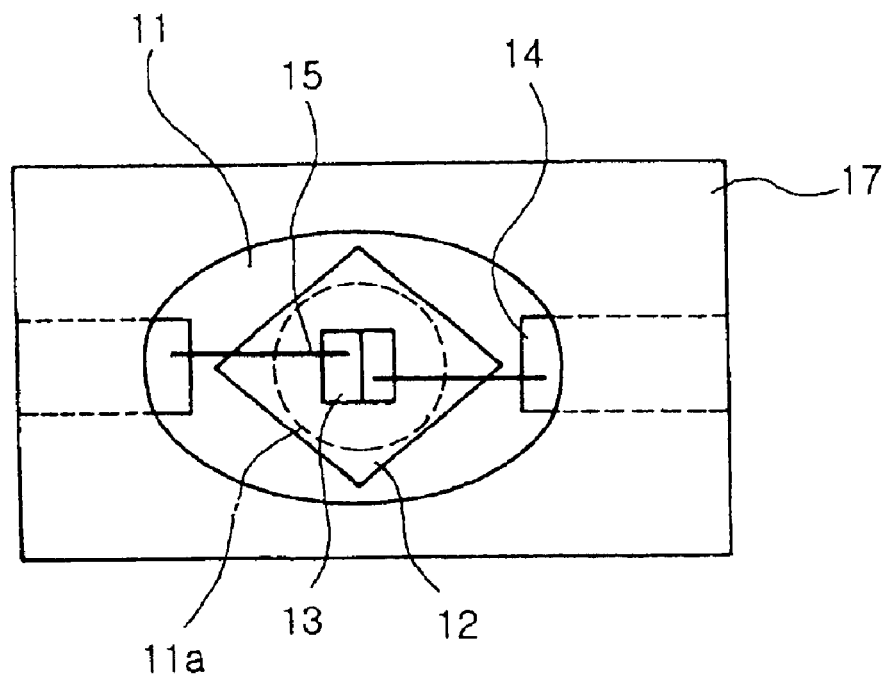

Covering the hole for heat sink 11a, the secondary ceramic sheet 12 is positioned on the ceramic substrate to offer a site on which the LED chip is mounted. Preferably, the secondary ceramic sheet 12 is made of alumina or SiC. The secondary sheet 12, although being formed into a square or a diamond in FIG. 2b, is freely shaped. As will be suggested below, the secondary sheet may have various shapes.

Mounted on the secondary ceramic sheet 12, the LED chip 13 is electrically connected with the electrodes on the ceramic substrate 11 via wires 15 or other patterned wires.

Irrespective of its shape or type, any LED chip can be applied to the present invention. Not only RGB LEDs, but also white LED may be used. The resulting structure is sealed with the insulating layer 16 and the upper ceramic sheet 17. While the upper ceramic sheet 17 is formed at the periphery of the LED, the insulating layer 16 is responsible for the central area covering the LED chip 13, the secondary ceramic sheet 12, the wires 15 and a part of the electrodes 16.

As for the insulating layer 16, it functions to protect the LED chip 13 from external physical and chemical damage such as erosion, impact, etc., and is made of a transparent material so as to transmit the light emitted from the LED chip 13. Epoxy or SiC based resins are suitable as materials for the insulating layer 16.

With reference to FIG. 3, there are shown various structures of LEDs in accordance with another embodiments of the present invention, in which reference numerals correspond to those of FIG. 2, respectively, for better understanding. Firstly, as shown in FIG. 3a, an LED chip 23 is mounted on a secondary ceramic sheet 22 with further a hole 22a for heat sink, which is positioned on a ceramic substrate 21 with a hole 21a for heat sink. For mounting, the hole for heat sink 22a must be smaller in diameter than the LED chip 23. The hole 22a for heat sink is also preferably smaller than the hole for heat sink 21a. With this structure, the LED chip 23 is in direct contact with air, so that the LED of FIG. 3a is anticipated to be superior in heat sink properties to the LED of FIG. 2.

Figure 3A:
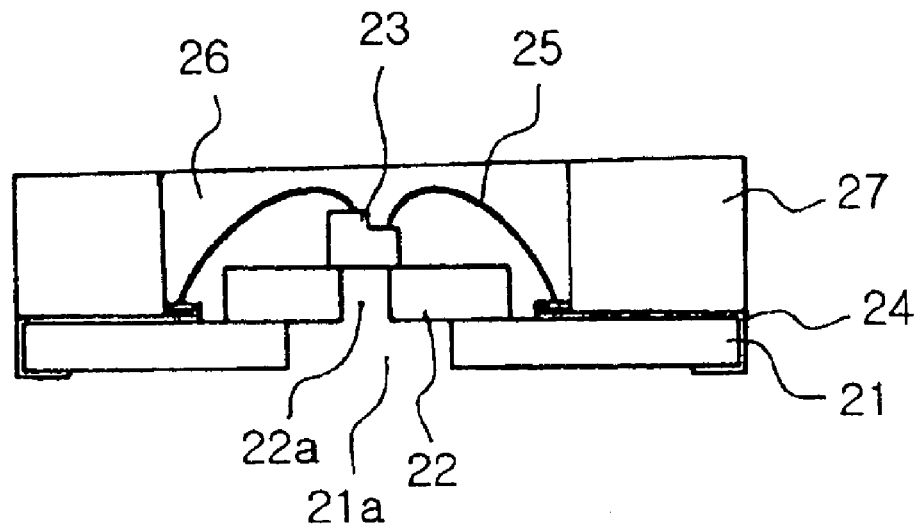
FIG. 3 schematically shows LEDs in cross sectional views, in accordance with embodiments of the present invention.
Figure 3B:
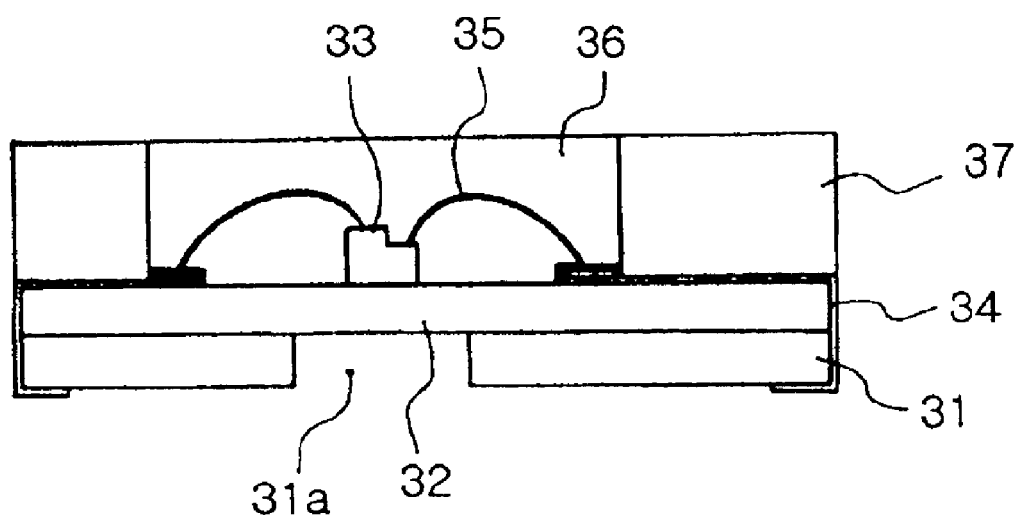

FIG. 3b illustrates a further embodiment of the present invention concerning an LED. In contrast to the LED suggested in FIG. 2, the LED of FIG. 3b has such a structure that a secondary ceramic sheet 32 is formed over the entire upper surface of a ceramic substrate 31 in which has a hole 31a for heat sink. In addition, electrodes 34 are located at the secondary ceramic sheet 32, but not at the ceramic substrate 31. This LED structure is greatly advantageous for fabrication processes, as will be explained later.

Figure 3C:
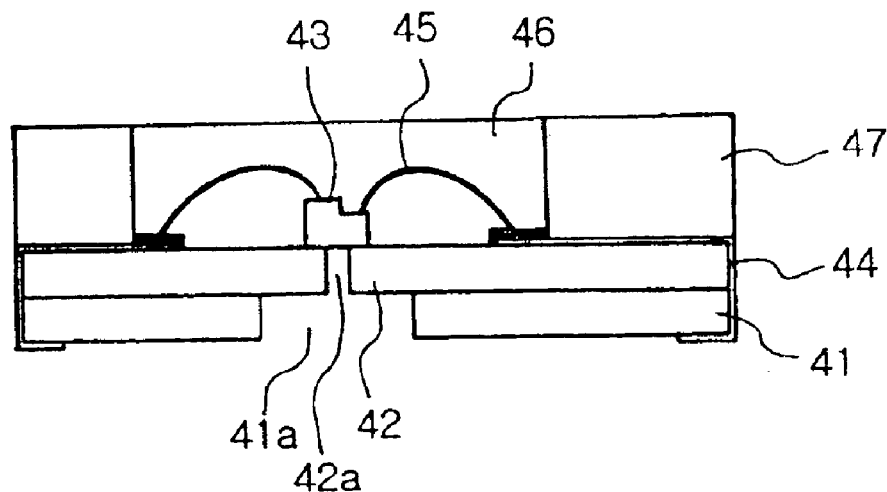

Another LED structure is shown in FIG. 3c, in accordance with still another embodiment of the present invention. As shown in FIG. 3c, the LED is similar to that of FIG. 3b, except that a hole for heat sink 42a is further provided to a secondary ceramic sheet 42. Accordingly, the LED of FIG. 3c possesses the advantages that are found in both the LEDs of FIGS. 3a and 3b. Concretely, this LED of FIG. 3c is further superior in heat sink properties to other ones and can be also fabricated by simpler process than a conventional process.

Figure 3D:
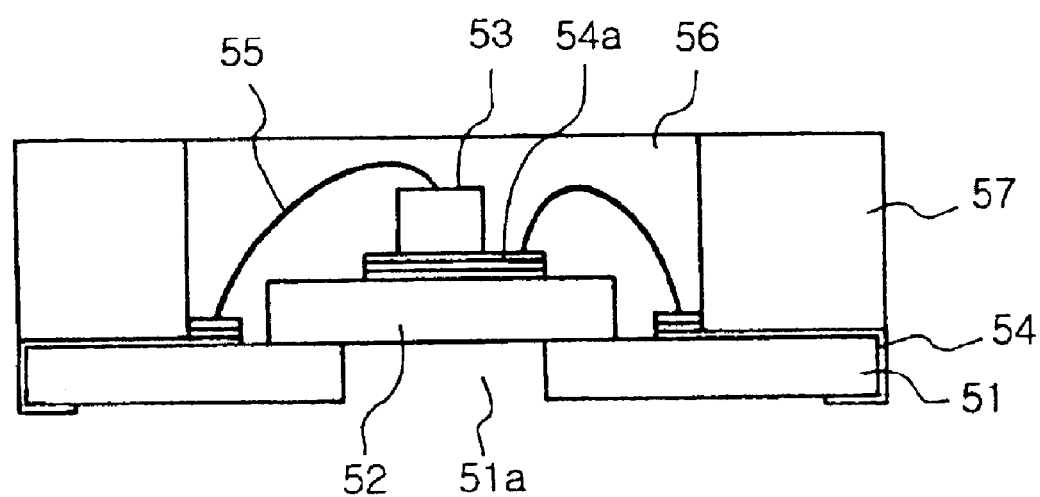

The above-illustrated LEDs are applicable to the case of the electrodes suitable for use in blue or white LED chips using nitride compound semiconductors. In the case of LED chips using other semiconductor compounds, such as GaAs, GaP, SiC, ZnSe, etc, their electric conductivity allows an electric field to be applied through the top and bottom parts of LED chips. Thus, bottom electrodes are provided below the LED chips. FIG. 3d shows an LED suitable for such an LED chip. The LED illustrated in FIG. 3d is quite different in electrode structure from those illustrated previously. As shown in FIG. 3d, an LED chip 53 and a second electrode 54a formed therebeneath are both mounted on a secondary ceramic sheet 52, and both of them are electrically connected with first electrodes 54 via wires 55. The ceramic substrate 51 has a hole for heat sink in this case, but the secondary ceramic sheet 52 may have also a hole for heat sink.

Figure 4A:
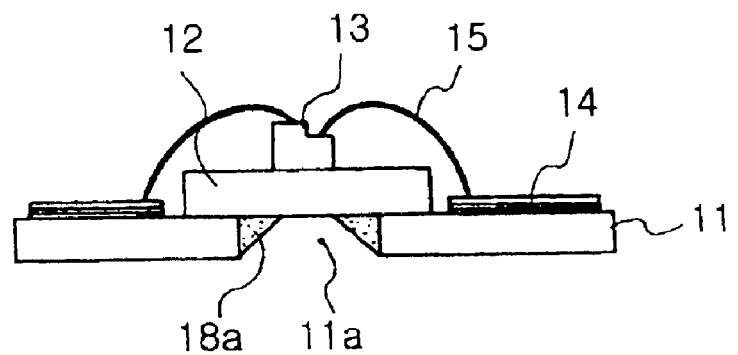
FIG. 4 schematically shows LEDs in cross sectional views, in accordance with other embodiments of the present invention.
Figure 4B:
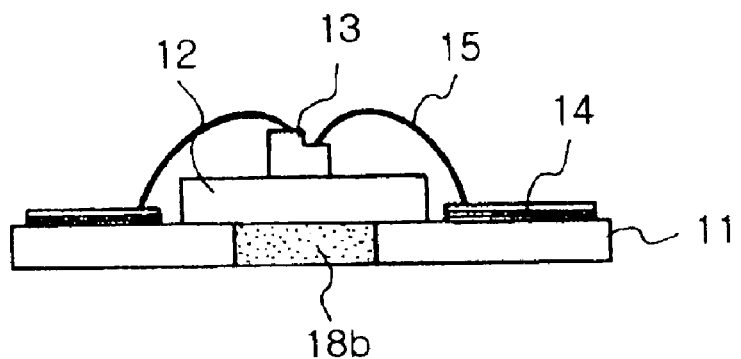
Figure 4C:
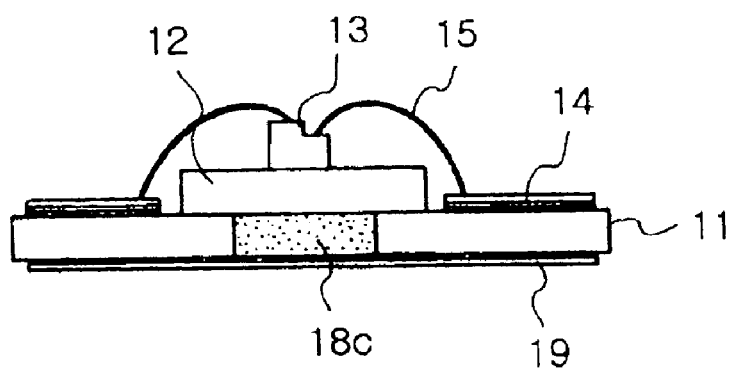
Figure 4D:
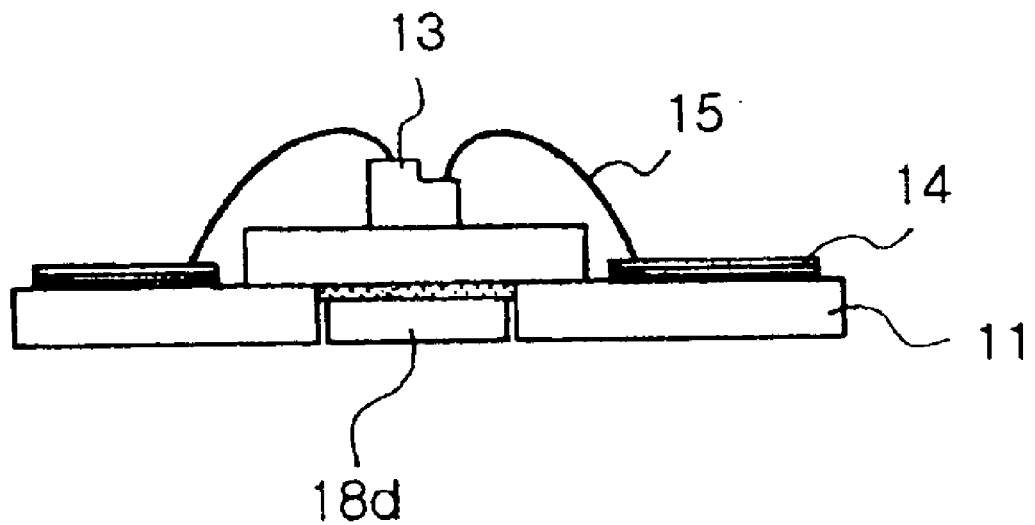
Figure 4E:
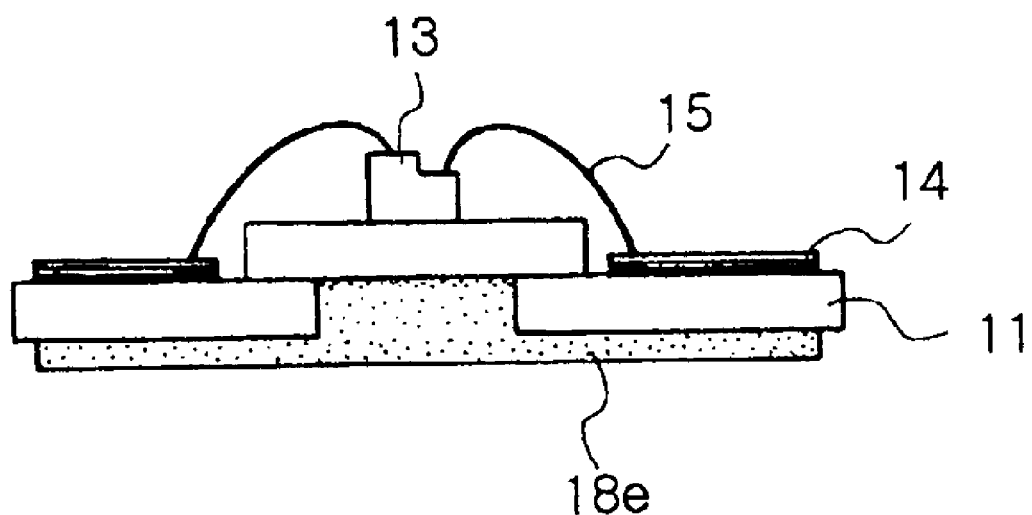

Through various designs for LED structures provided with holes for heat sink, LEDs can be lowered in thermal stress, as explained above. Additionally, application of conductive materials, for example, coating or filling conductive materials to the holes for heat sink can make the LEDs release heat at greater efficiency. Examples of such applications for the LED of FIG. 2 are illustrated in FIG. 4. In FIG. 4a, there is a modified LED in which a metal paste 18a is coated along the contact line between the secondary ceramic sheet 12 and the ceramic sheet 11 within the hole for heat sink 11a. FIG. 4b shows an LED in which the hole for heat sink 11a is filled with a metal paste 18b. The LED of FIG. 4c is similar to that of FIG. 4b, except that a metal plate 19 is provided beneath the structure of FIG. 4b, being attached to the metal paste 18c filling the hole for heat sink 11a. In the LED of FIG. 4d, a metal lump or slug 18d is inserted within the hole for heat sink 11a, being attached to the secondary ceramic sheet via a metal paste. FIG. 4e shows an LED in which a metal paste 18e is filled in the hole for heat sink, as well as being coated over the lower surface of the ceramic substrate 11. The LEDs introduced in FIG. 4 can release the internally generated heat through the metal applications attached to the hole for heat sink to the exterior more easily and thus are superior in heat sink properties, compared to the LEDs which have holes for heat sink only. Of course, such applications are applicable for the LEDs of FIG. 3, which show diversity in designs of holes for heat sink.

Below, a detailed description will be given of the fabrication of such LEDs with the LED of FIG. 2 as a central figure.

First, a ceramic sheet 11 with a hole for heat sink 11a is prepared. The hole for heat sink 11a may be easily formed by punching. Then, electrodes 14 are disposed on the ceramic sheet 11 by, for example, screen printing. The patterns of electrodes may be formed in various designs. Ag-containing paste is suitable for use as a material for patterning the electrodes. The ceramic substrate 11 may be of one layer or two. In addition, the ceramic substrate, if necessary, may have other wire patterns thereon.

After the preparation of the ceramic substrate, a secondary ceramic sheet 12, which is sufficiently large to cover the hole for heat sink 11a, is formed on the ceramic substrate 11. In the case of the LED of FIG. 3b, the secondary ceramic sheet 32 is as large as the ceramic substrate 31.

Next, there is prepared an upper ceramic sheet 17 with an opening through which a part of the electrodes, and a part of or all of the secondary ceramic sheet can be exposed to the exterior when the upper ceramic sheet 17 is formed on the ceramic substrate 11. Following the stacking of the upper ceramic sheet 17 on the ceramic substrate 11, the stacked ceramic substrate of the resulting structure are preferably co-fired at about 800 to 1,050° C.

Subsequently, electrodes are formed on the patterned electrodes by plating. In this regard, Ni and Au are preferably plated on the electrodes patterned with Ag paste on ceramic substrate, in order. After the formation of electrodes, an LED chip 13 is mounted on the secondary ceramic sheet 12.

Afterwards, the electrodes are electrically connected with the LED chip via wires 15, followed by sealing the LED chip 13 with an insulating resin 17.

[Light Emitting Device and Fabrication Thereof]

In accordance with another aspect, the present invention also pertains to light emitting devices which employ the LEDs of various heat sink designs as elementary units and are greatly reduced in thermal stress, and fabrication thereof. The light emitting devices are fabricated not by mounting a LED chip on a PCB individually, but by mounting a multitude of LED chips on consecutive metal electrode patterns in integrated packages.

With reference to FIG. 5, a structure of a light emitting device is schematically illustrated in a cross sectional view (a) and in a plane view (b), in accordance with another embodiment of the present invention. As seen in these figures, the light emitting device of the present invention generally comprises a ceramic substrate 111, a plurality of secondary ceramic sheets 112 (112') located on the ceramic substrate 111, an insulating layer 116, an upper ceramic sheet 117, a plurality of LED chips 113 (113'), and electrodes 14. This light emitting device has the structure which results from a combination of many LEDs of FIG. 2.

In this embodiment, the ceramic substrate 111 has a multitude of holes for heat sink 111a (111a'). The electrodes are disposed on the surface of the ceramic substrate 111 at opposite sides of each of the holes 111a. Positioned below the LED chips 113 (113'), the holes for heat sink 111a preferably function to immediately release the heat generated by the LED chips 113 (113') to air to minimize the thermal stress of the light emitting device. The holes for heat sink 111a (111a') always need not be circular, but may be any form such as rectangle, polygons, etc. Examples of useful ceramic substrates, but not by limitation, include alumina and SiC with preference for alumina.

Figure 5A:
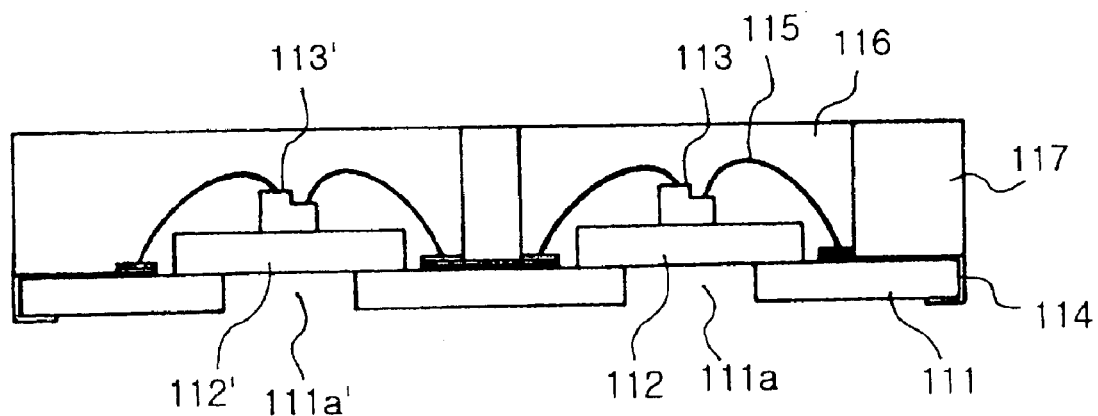
FIG. 5 schematically shows the structure of a light emitting device in cross sectional view and a plane view, in accordance with another embodiment of the present invention.
Figure 5B:
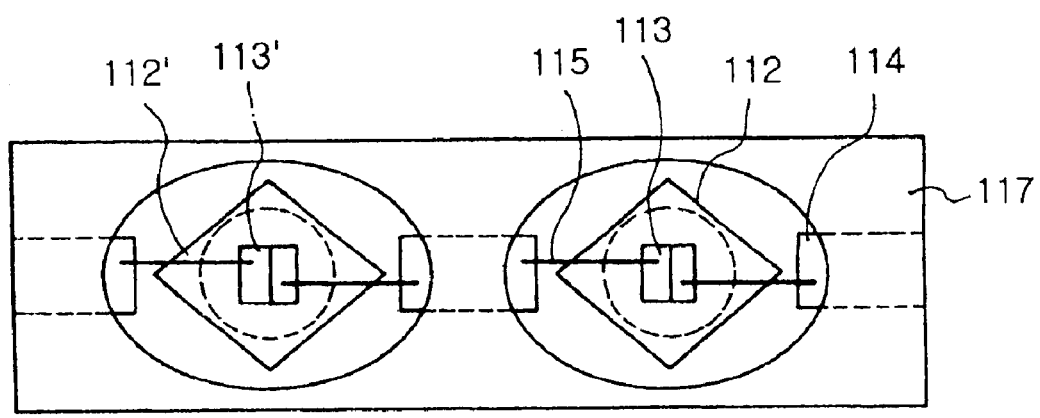

Covering the holes for heat sink 111a (111a'), the secondary ceramic sheets 112 (112') are positioned on the ceramic substrate 111 to offer sites on which the LED chips are mounted. Preferably, the secondary ceramic sheets 112 (112') are made of alumina or SiC. The secondary sheets 112 (112'), although being formed into a square or a lozenge in FIG. 5b, are freely shaped. As will be suggested below, the secondary sheets 112 (112') may have various shapes. The secondary ceramic sheets 112 (112') shown in FIG. 5a are independent ones each of which is located on the ceramic substrate 111, covering one hole for heat sink 111a, but they may be formed in such a structure to cover two or more holes for heat sink 111a (111a') (see FIGS. 3b, 3c, 10b and 11b).

Mounted on the secondary ceramic sheets 112 (112'), the LED chips 113 (113') are electrically connected with the electrodes 114 on the ceramic substrate 111 via wires 115 or other patterned wires. Irrespective of its shape or type, any LED chip can be applied to the present invention. Not only RGB LEDs, but also white LED may be used. The LED chips 113 (113') are sealed with the insulating layer 116 and surrounded by the upper ceramic sheet 117. The insulating layer 116 is preferably made of a transparent material such as epoxy or SiC based resin.

With reference to FIG. 6, there are shown structures of LED devices in accordance with another embodiment of the present invention, in which reference numerals correspond to those of FIG. 5, respectively, for better understanding.

Figure 6A:
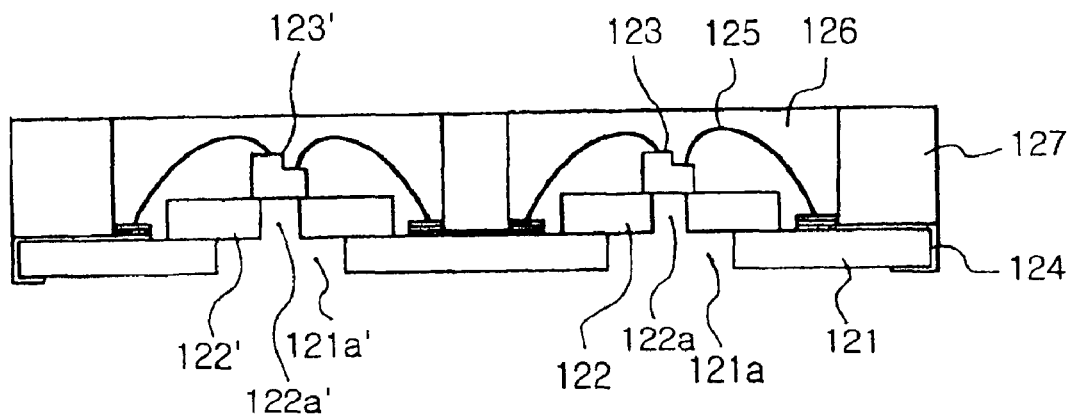
FIG. 6 schematically shows light emitting devices in cross sectional views, in accordance with still other embodiments of the present invention.

In the light emitting device as shown in FIG. 6a, LED chips 123 (123') are mounted on secondary ceramic sheets 122 (122') with further holes for heat sink 122a (122a'), which are positioned on a ceramic substrate 121 with holes 121a (121a') for heat sink. This light emitting device has the structure resulting from a combination of many LEDs of FIG. 3a. For mounting, the holes for heat sink 122a (122a') must be smaller in diameter than the LED chips 123 (123's). Also, the holes for heat sink 122a (122a') are preferably smaller than the holes 121a (121a') for heat sink. With this structure, the LED chips 123 (123') are in direct contact with air, so that the light emitting device of FIG. 6a is anticipated to be superior in heat sink properties to the light emitting device of FIG. 5.

Figure 6B:
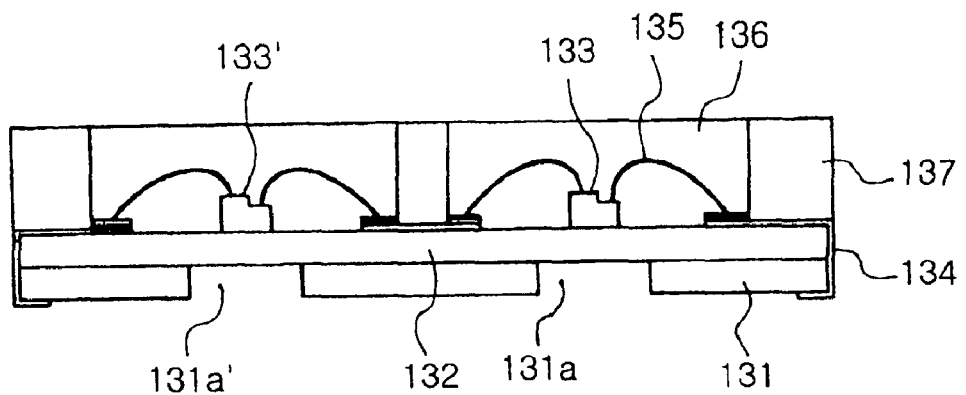

FIG. 6b illustrates a further embodiment of the present invention concerning a light emitting device. In contrast to the light emitting device suggested in FIG. 5, the light emitting device of FIG. 6b has such a structure that a secondary ceramic sheet 132 is formed over the entire upper surface of a ceramic substrate 131. In addition, electrodes 134 are located at the secondary ceramic sheet 132, but not at the ceramic substrate 131. Having the structure resulting from a combination of LEDs of FIG. 3b, this light emitting device structure is greatly advantageous for fabrication process, as will be explained later.

Figure 6C:
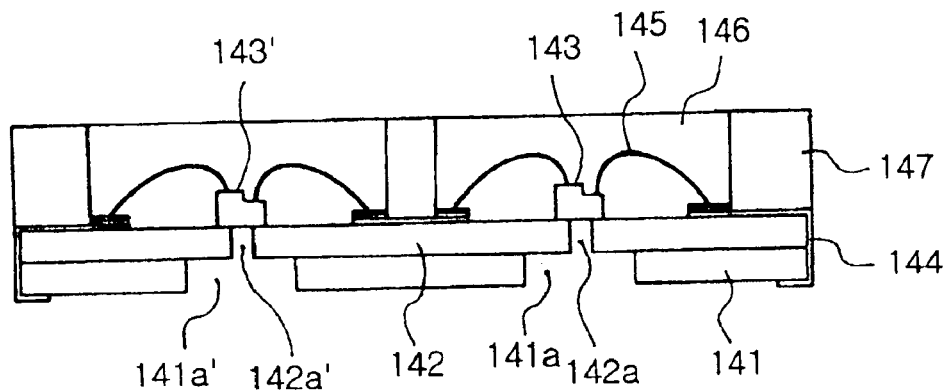

Another light emitting device structure is shown in FIG. 6c, in accordance with still another embodiment of the present invention. Resulting from an assembly of LEDs of FIG. 3c, this light emitting device is similar to that of FIG. 3b, except that holes for heat sink 142a (142a') are further provided to a secondary ceramic sheet 142.

Figure 6D:
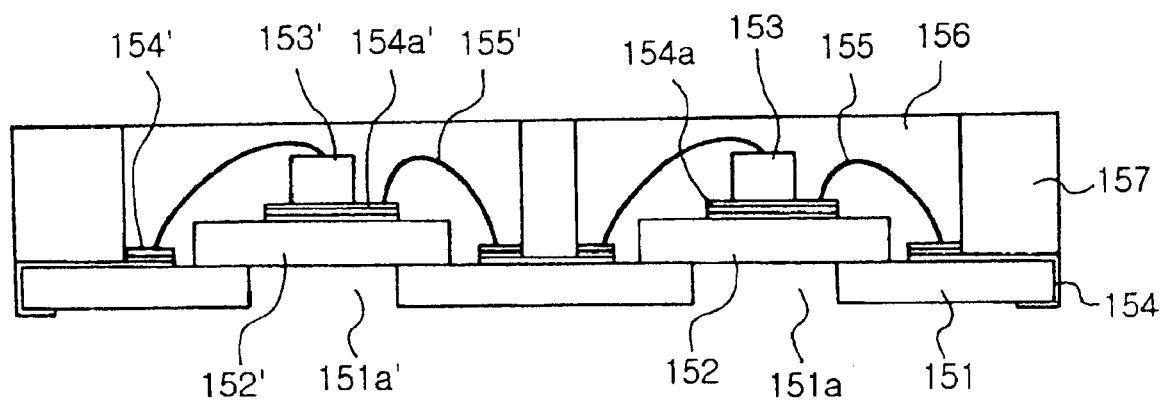

The light emitting device illustrated in FIG. 6d has the structure resulting from a combination of LEDs of FIG. 3d. Owing to the electrical conductivity of the substrate itself, an electric field is applied through the top and bottom parts of LED chips in the light emitting device. As shown in FIG. 6d, in the light emitting, LED chips 153 (153') and a second electrode 154a (154a') formed therebeneath are both mounted on secondary ceramic sheets 152 (152') and both of them are electrically connected with first electrodes 154 (154') via wires 155 (155'), respectively. The ceramic substrate 151 has holes for heat sink 151a (151a') in this case, but the secondary ceramic sheets 152 (152') may have holes for heat sink.

Figure 7A:
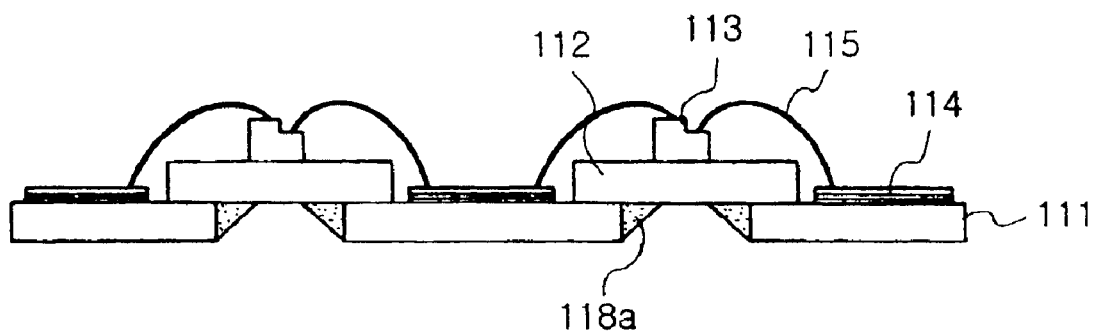
FIG. 7 schematically shows light emitting devices in cross sectional views, in accordance with yet other embodiments of the present invention.
Figure 7B:
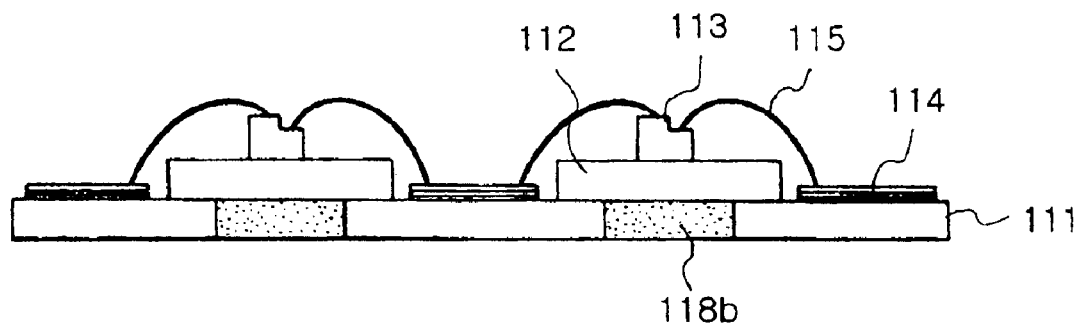
Figure 7C:
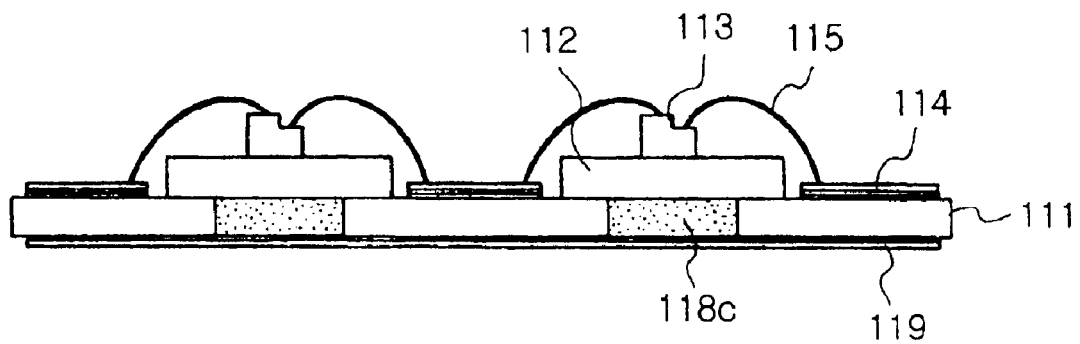
Figure 7D:
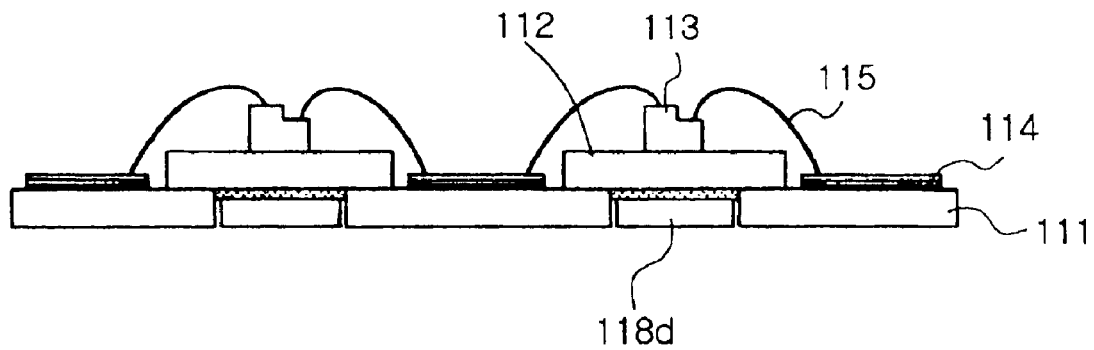
Figure 7E:
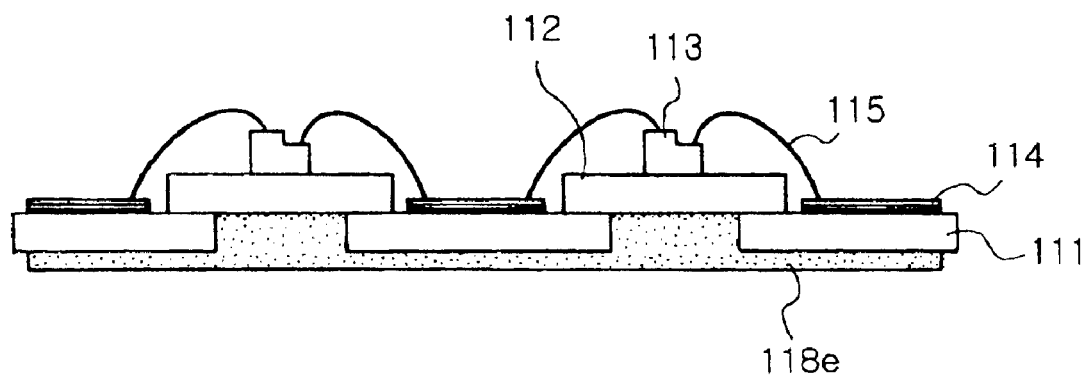
Figure 12A:
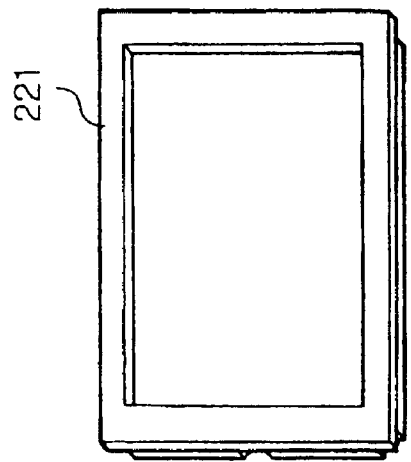
FIG. 12 shows examples of upper ceramic sheets applicable for the present invention.
Figure 12B:
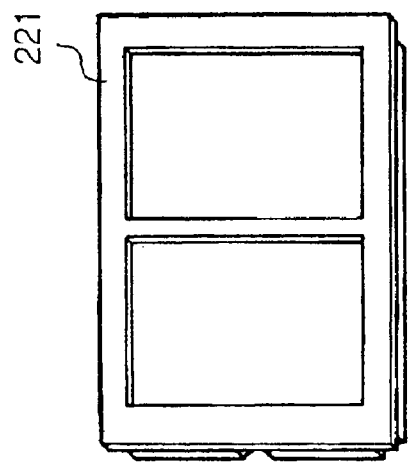
Figure 12C:
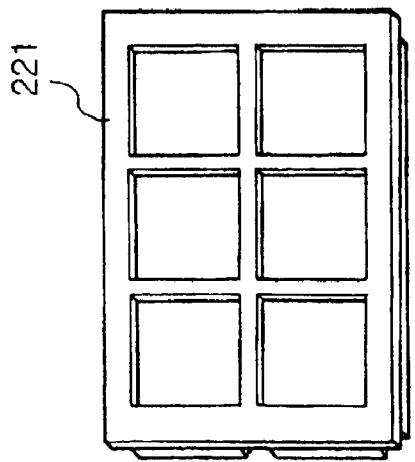
Figure 12D:
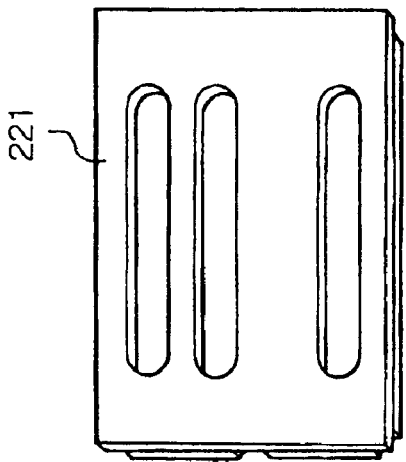
Figure 12E:
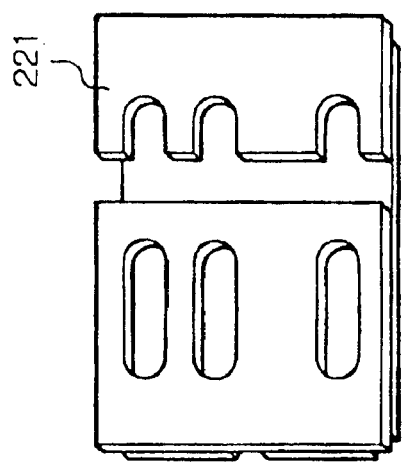
Figure 12F:
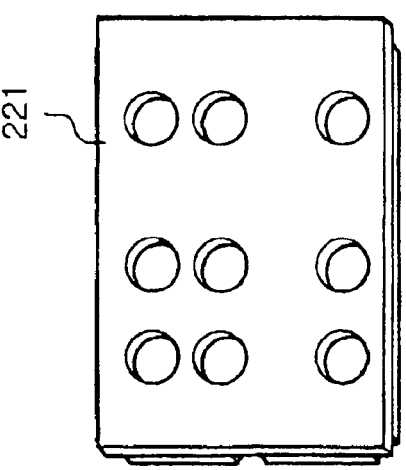

Through various designs for light emitting device structures provided with holes for heat sink, light emitting devices can be lowered in thermal stress, as explained above. Additionally, application of conductive materials, for example, coating or filling conductive materials to the holes for heat sink can make the LEDs release heat at higher efficiency. Examples of such applications for the light emitting device of FIG. 5 are illustrated in FIG. 7. In FIG. 7a, there is a modified light emitting device in which a metal paste 118a is coated along the contact line between the secondary ceramic sheet 112 and the ceramic sheet 111 within the hole for heat sink 111a. FIG. 7b shows a light emitting device in which the hole for heat sink 111a is filled with a metal paste 118b. The light emitting device of FIG. 7c is similar to that of FIG. 7b, except that a metal plate 119 is provided beneath the structure of FIG. 7b, being attached to the metal paste 118c filling the hole for heat sink 111a. In the light emitting device of FIG. 7d, a metal lump or slug 118d is inserted within the hole for heat sink 111a, being attached to the secondary ceramic sheet 112 via a metal paste. FIG. 7e shows a light emitting device in which a metal paste 118e is filled in the hole for heat sink 111a, as well as being coated over the lower surface of the ceramic substrate 111. The light emitting devices introduced in FIG. 7 can release the internally generated heat through the metal applications attached to the hole for heat sink to the exterior more easily and thus are superior in heat sink properties, compared to the light emitting devices which have holes for heat sink only. Of course, such applications are applicable for the light emitting devices of FIG. 6, which show-diversity in designs of holes for heat sink.

Below, a detailed description will be given of the fabrication of such light emitting devices with the light emitting device of FIG. 5 as a central figure, in conjunction with FIG. 8. The light emitting device can be fabricated by a method similar to a fabrication method for an unit LED, but its fabrication may be variously performed.

First, as shown in FIGS. 8a and 8b, a ceramic sheet 111 with a pattern of holes 111a (111a') for heat sink is prepared. The holes 111a (111a') for heat sink on the ceramic sheet can be easily formed by punching. Then, electrodes 114 are disposed on the ceramic sheet 111 by, for example, screen printing, as shown in FIG. 8c. The patterns of electrodes may be formed in various designs. Ag-containing paste is suitable for use as a material for the patterned electrodes. The ceramic substrate 111 may be of one ceramic sheet or more. In addition, the ceramic substrate, if necessary, may have other wire patterns thereon.

After the preparation of the ceramic substrate, secondary ceramic sheets 112 (112') are formed on the ceramic substrate 111 to cover the holes for heat sink 111a (111a'), respectively, as shown in FIG. 8d. The secondary ceramic sheets 112 (112') shown in FIG. 8d are independent ones each of which is located on the ceramic substrate 111, covering one hole for heat sink, but they may be formed in such a structure to cover two or more holes for heat sink 111a (111a'). FIG. 9 shows an example of the latter case. According to a process illustrated in FIGS. 9a to 9c, an individual secondary ceramic sheet 162, which is so large as to cover a series of holes for heat sink 161a, 161b and 161c, is formed on a ceramic substrate 161, followed by stacking an upper ceramic sheet 167 on the ceramic substrate 161. The secondary ceramic sheets may have holes for heat sink (see FIG. 6a).

Next, as shown in FIG. 8e, there is prepared an upper ceramic sheet 117 with openings through which a part of the patterned electrodes, and a part of or all of the secondary ceramic sheets can be exposed to the exterior when the upper ceramic sheet 117 is formed on the ceramic substrate 111. Following the stacking of the upper ceramic sheet 117 on the ceramic substrate 111, the resulting structure is co-fired preferably at about 800 to 1,050° C.

Subsequently, as shown in FIG. 8f, electrodes 114 are formed on the patterned electrodes by plating. In this regard, Ni and Au are preferably plated at the Ag paste layer on ceramic substrate, in order. After the formation of electrodes, LED chips 113 (113') are mounted on the secondary ceramic sheets 112 (112').

Afterwards, the electrodes 114 are electrically connected with the LED chips 113 (113') via wires 115 (115'), followed by sealing the LED chips 113 (113') with an insulating resin 116.

Turning to FIG. 10, there is illustrated a process for fabricating a light emitting device in accordance with another embodiment of the present invention. After completion of the process, the light emitting device will have the structure of FIG. 6c. Over the fabrication process of FIG. 8, the fabrication process illustrated in FIG. 10 has the advantage of being very simple because only one secondary ceramic sheet is employed. This fabrication process of FIG. 10 is featured in that a pattern of electrodes is not formed on a ceramic substrate 151 provided with holes 151a (151a') for heat sink, but on the secondary sheet 152. In detail, holes 152a (152a') for heat sink which are smaller than the holes 151a (151a') for heat sink and the LED chips are provided for the secondary ceramic sheet 152 by punching process. On the ceramic substrate is stacked the secondary ceramic sheet in such a way that the holes 152a (152a') for heat sink are positioned to be concentric with the holes 151a (151a') for heat sink, as shown in FIG. 10c, and then a pattern of electrodes 154 is formed on the secondary ceramic sheet 152, as shown in FIG. 10d. Subsequent processes are the same as in FIG. 8.

In accordance with another embodiment, additional openings for heat sink, aside from holes for heat sink, may be provided to the ceramic substrate. FIG. 11 shows this embodiment. As shown in FIG. 11, additional openings for heat sink 171b are formed near the holes for heat sink 171a (171a') by punching. Because the light emitting device of this structure can release the heat generated from LED chips through a greater area to air, a greater multitude of the light emitting devices can be assembled into a light emitting unit assembly at a higher density. Additionally, the light emitting unit assembly can be structured to have a larger area.

As for the upper ceramic sheet 177, it may be versatile in pattern. In other words, the upper ceramic sheet can be designed to have various patterns corresponding to given conditions, such as requirements of end-users or use conditions. FIG. 12 shows various pattern examples of the upper ceramic sheet. In the openings or windows of the upper ceramic sheet are distributed a suitable number of LEDs according to requirements for screen areas and shapes.

[Light Emitting Unit Assembly]

Figure 13:
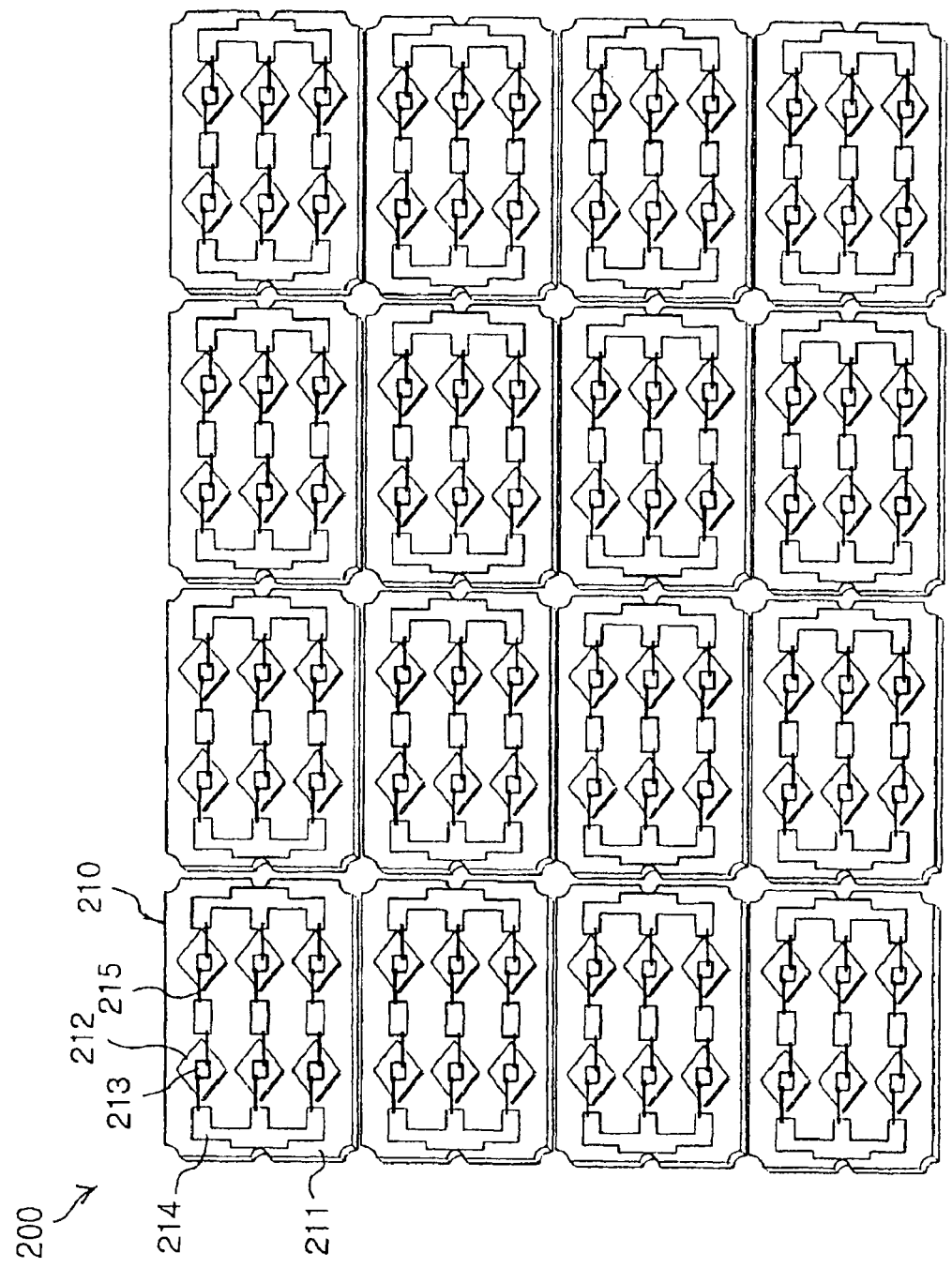
FIG. 13 is a schematic view showing the structure of a large area light emitting unit assembly, composed of LEDs of the present invention.

At least one of the light emitting devices described above is used to construct a large area light emitting unit assembly. FIG. 13 shows an example of the light emitting unit assemblies, in which the upper ceramic sheet is omitted for better understanding. The structure of the light emitting unit assembly is dependent on the distribution of light emitting units 210, or light emitting devices. In addition, the light emitting unit assembly can be prepared to have a desired light emitting area and shape through the formation of the upper ceramic sheet into the desired area and shape and thus, the intensity of the light radiated from LED chips can be controlled. Particularly, various designs for implementing the heat sink function can be applied to the light emitting unit assembly of the present invention. With preferable designs, the heat generated from the LED chips can be easily dissipated so that large area LED displays can be fabricated.

As described hereinbefore, the present invention offers various designs suitable for efficiently dissipating the heat generated from LED chips, providing LEDs which suffer from minimal thermal stress and can be operated stably. In addition, the present invention provides a light emitting device which can be applied to a large area display. The light emitting device of the present invention can be used as a light emitting source for full color displays, as well as substituting for conventional luminaire, such as incandescent electric lamps, fluorescent lamps, etc.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating a light emitting diode, comprising the steps of:

preparing a ceramic substrate having a hole for heat sink;

stacking a secondary ceramic sheet on said ceramic substrate;

disposing electrode patterns in a predetermined pattern on said secondary ceramic sheet around the hole;

stacking on said ceramic substrate an upper ceramic sheet with an opening to form a stacked ceramic substrate in such a way that a part of the electrodes of said secondary ceramic sheet are exposed through said opening;

co-firing said stacked ceramic substrate; mounting a LED chip on said secondary ceramic sheet at a position corresponding to the hole after disposing electrodes on the electrode patterns of said secondary ceramic sheet; and sealing said LED chip within said upper ceramic sheet with an insulating resin after electrically connecting said electrodes with said LED chip.

2. The method as claimed in claim 1, wherein said ceramic substrate and/or the ceramic sheets are made of alumina or SiC.

3. The method as claimed in claim 1, wherein said electrode patterns are disposed of Ag paste, and said electrodes are formed by plating Ni and Au on the electrode patterns.

4. The method as claimed in claim 1, wherein said insulating resin is made of epoxy or an Si-based transparent resin.

5. The method as claimed in claim 1, wherein said co-firing is conducted at 800 to 1,050° C.

6. The method as claimed in claim 1, wherein metal paste is coated along the contact line between said secondary ceramic sheet and said ceramic substrate in the hole of heat sink.

7. The method as claimed in claim 1, wherein the hole for heat sink is filled with metal paste.

8. The method as claimed in claim 7, wherein the hole for heat sink is filled with metal paste and a metal plate is attached on bottom surface of said ceramic substrate.

9. The method as claimed in claim 7, wherein the hole for heat sink is fully filled with a metal paste and said ceramic substrate is entirely coated with a metal paste on its bottom surface.

10. The method as claimed in claim 1, wherein a metal lump or slug is inserted in the hole for heat sink.

11. The method as claimed in claim 1, wherein said secondary ceramic sheet has a hole for heat sink which is smaller than said light emitting chip and the hole for heat sink of said ceramic substrate.

12. A method for fabricating a light emitting diode, comprising the steps of:

preparing a ceramic sheet having a hole for heat sink, said ceramic sheet formed electrode patterns in a predetermined pattern thereon to make a ceramic substrate;

stacking a secondary ceramic sheet on said ceramic substrate to cover the hole for heat sink;

stacking on said ceramic substrate an upper ceramic sheet with an opening to form a stacked ceramic substrate in such a way that a part of the electrode patterns and a part or all of said secondary ceramic sheet are exposed through said opening;

co-firing said stacked ceramic substrate;

mounting a LED chip on said secondary ceramic sheet at a position corresponding to the hole after disposing electrodes on the electrode patterns of said ceramic substrate; and sealing said LED chip within said upper ceramic sheet with an insulating resin after electrically connecting the electrodes with said LED chip.

13. A method for fabricating a light emitting device, comprising the steps of:

preparing a ceramic substrate having a plurality of holes for heat sink;

stacking a secondary ceramic sheet on said ceramic substrate;

disposing electrodes patterns in a predetermined pattern on said secondary ceramic sheet around each of the holes;

stacking on said secondary ceramic sheet an upper ceramic sheet with an opening to form a stacked ceramic substrate in such a way that a part of the electrode patterns are exposed through the opening;

co-firing said stacked ceramic substrate;

mounting LED chips on said secondary ceramic sheet at a position corresponding to each of the holes after disposing electrodes on the electrode patterns of said secondary ceramic sheet; and sealing said LED chips within said upper ceramic sheet with insulating resin after electrically connecting said electrodes with said LED chips.

14. The method as claimed in claim 13, wherein said secondary ceramic sheet has holes for heat sink which are smaller than said light emitting chips and the holes for heat sink of said ceramic substrate.

15. A method for fabricating a light emitting device, comprising the steps of:

preparing a ceramic substrate having a plurality of holes for heat sink, said ceramic substrate being formed electrode patterns in a predetermined pattern thereon around each of the holes;

stacking secondary ceramic sheets on said ceramic substrate to cover each of the holes for heat sink;

stacking on said ceramic substrate an upper ceramic sheet with an opening to form a stacked ceramic substrate in such a way that a part of said electrode patterns and a part or all of said secondary ceramic sheets are exposed through said opening;

co-firing said stacked ceramic substrate; mounting LED chips on said secondary ceramic sheets at a position corresponding to each of the holes after disposing electrodes on the electrode patterns of said ceramic substrate; and sealing said LED chips within said upper ceramic sheet with insulating resin after electrically connecting said electrodes with said LED chips.

16. The method as claimed in claim 15, wherein each of said secondary ceramic sheets are independently positioned on said ceramic substrate as to cover each hole for heat sink.

17. The method as claimed in claim 15, wherein said secondary ceramic sheets are independently positioned on said ceramic substrate to cover at least two holes or more for heat sink.

18. The method as claimed in claim 15, wherein said ceramic substrate has additional openings for heat sink, aside from the holes for heat sink.

19. The method as claimed in claim 15, wherein each of said secondary ceramic sheets have a hole for heat sink beneath said light emitting diode chip.

* * * * *